United States Patent
Van As et al.

(10) Patent No.: US 7,806,577 B2
(45) Date of Patent: Oct. 5, 2010

(54) HIGH BRIGHTNESS LIGHT EMITTING DIODE DEVICE

(75) Inventors: Marco Van As, Eindhoven (NL); Joseph Ludovicus Antonius Maria Sormani, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 384 days.

(21) Appl. No.: 12/088,434

(22) PCT Filed: Sep. 15, 2006

(86) PCT No.: PCT/IB2006/053318

§ 371 (c)(1), (2), (4) Date: Mar. 28, 2008

(87) PCT Pub. No.: WO2007/036829

PCT Pub. Date: Apr. 5, 2007

(65) Prior Publication Data

US 2008/0253118 A1 Oct. 16, 2008

(30) Foreign Application Priority Data

Sep. 28, 2005 (EP) .................................. 05108964

(51) Int. Cl.
*F21V 8/00* (2006.01)
(52) U.S. Cl. .................... 362/555; 362/558; 362/800; 362/311.02; 362/612
(58) Field of Classification Search .............. 362/555, 362/558, 800, 249.02, 311.02, 612, 602, 362/616

See application file for complete search history.

(56) References Cited

U.S. PATENT DOCUMENTS

| | | | |
|---|---|---|---|
| 6,325,524 B1 | 12/2001 | Weber et al. | |
| 2002/0135298 A1 | 9/2002 | Pelka et al. | |
| 2004/0203189 A1 | 10/2004 | Chen et al. | |
| 2005/0067944 A1 | 3/2005 | Masuda et al. | |
| 2005/0281048 A1* | 12/2005 | Coushaine et al. | 362/555 |
| 2006/0067090 A1* | 3/2006 | Lee et al. | 362/615 |
| 2006/0114420 A1* | 6/2006 | Kim et al. | 353/81 |
| 2006/0164857 A1* | 7/2006 | Morejon et al. | 362/555 |

FOREIGN PATENT DOCUMENTS

| | | |
|---|---|---|
| JP | 04137675 A | 5/1992 |
| WO | 0207131 A1 | 1/2002 |
| WO | 2004049462 A1 | 6/2004 |

* cited by examiner

*Primary Examiner*—Laura Tso

(57) ABSTRACT

The present invention relates to a light emitting diode (LED) device (10) comprising (a plurality of LED chips (12) placed on a substrate, and a plurality of light guiding elements (16, 36) each having and an entrance window (24) and an exit window (26) wherein the elements are arranged for allowing light from at least one LED chip to be transferred from the entrance window to the exit window, and wherein the elements are further arranged so that said exit windows form several inner side surfaces (20) of a cavity (22), which cavity further has an exit aperture (30) for allowing extraction of light from the device. This configuration allows for a high brightness LED device.

15 Claims, 6 Drawing Sheets

HIGH BRIGHTNESS LIGHT EMITTING DIODE DEVICE

The present invention relates to a light emitting diode (LED) device comprising a plurality of LED chips.

BACKGROUND OF THE INVENTION

LED chips are increasingly being used for illumination and lighting purposes. For example to create white light, blue or UV LEDs coated with phosphor are used, so-called phosphor converted LEDs. The phosphor converts at least some of the blue radiation to for example yellow light. Together, the non-converted blue light and the yellow light generate a white light.

However, individual LED chips do currently not provide sufficient brightness for many applications, like projections displays and car head lighting. Therefore, LED devices comprising arrays of LED chips are used, for example as disclosed in the document U.S. Pat. No. 6,325,524. In U.S. Pat. No. 6,325,524, as well as in many other known multi LED chip devices, several LED chips are positioned besides each other on a substrate. The light from the LED chips is then collected by an optical system covering the LED chips. However, due to the wide extension of the optical system covering all the LED chips, there is a low amount of light per unit of surface area, resulting in low brightness.

BRIEF SUMMARY OF THE INVENTION

It is an object of the present invention to overcome this problem, and to provide an improved, high brightness LED device.

This and other objects that will be evident from the following description are achieved by means of an LED device comprising a plurality of LED chips placed on a substrate, and a plurality of light guiding elements each having an entrance window and an exit window, wherein the elements are arranged for allowing light from at least one LED chip to be transferred from the entrance window to the exit window, and wherein the elements are further arranged so that the exit windows form several inner side surfaces of a cavity, which cavity further has an exit aperture for allowing extraction of light from the device.

The invention is based on the understanding that by guiding light from a plurality of LED chips to a common cavity, the luminance of the exit aperture of the cavity can be higher than the luminance of a single LED chip. This without the size of the exit aperture significantly exceeding the size of one of the LED chips. Thus, a high brightness LED device can be achieved.

Preferably, at least one additional LED chip is placed on the substrate for emitting light at the bottom surface of the cavity opposite the exit aperture. This further increases the brightness of the LED device. The at least one additional LED chip can for example be positioned at the bottom surface of the cavity, in case the cavity is reasonably in level with the substrate. Alternatively, the at least one additional LED chip can be provided with an additional light guiding element for transferring light from the additional LED chip(s), from an entrance window to an exit window of the additional light guiding element, wherein the bottom surface of the cavity is essentially formed by the exit window. The additional light-guiding element is useful for example in case the cavity is not in level with the substrate.

Suppose that the cavity has four inner side surfaces, each inner side surface with one exit window transferring light from one LED chip. In addition, a fifth LED chip is placed at the bottom surface of the cavity. Further, the size of the bottom surface and the size of the exit aperture preferably correspond to the area of the bottom LED chip. In such a case, for a loss less system, the brightness could be five times larger than for a single LED chip, with maintained light emitting area.

In one embodiment of the present invention, each light guiding element is a triangular prism having a first, second and third side face, wherein the first and second side faces are arranged at an essentially right angle. That is, the area of the base of the prism is a right-angled triangle. Further, the entrance window can be formed on at least a portion of one of the right-angled side faces, and the exit window can formed on at least a portion of the other right-angled side face. Preferably, the size of the entrance and exit windows corresponds to the size of the LED chip. In a case where the entrance window and exit window cover essentially the entire right-angled side faces, respectively, the LED chips can be positioned closed together on the substrate, which allows a compact LED device. In a case where the entrance window and exit window only cover a portion of the right-angled side faces, respectively, the LED chips can be positioned further away from each other on the substrate, which facilitates manufacturing.

Preferably, the side face accommodating the exit window and the third side face are arranged at an angle of about 45°. However, the side face accommodating the exit window and the third side face could alternatively be arranged at an acute angle. This improves the total internal reflection inside the prism.

In another embodiment of the present invention, the light guiding elements further comprises a rectangular parallelepiped extending the triangular prism at one of the right-angled side faces of the prism, wherein the entrance window is formed on at least a portion of the other right-angled side face, and the exit window is formed on at least a portion of the face of the rectangular parallelepiped opposite the face towards the prism. This allows the LED chips to be positioned further away from each other on the substrate, which facilitates manufacturing. The triangular prism and the rectangular parallelepiped can be formed in one piece, i.e. they are created and formed integrally in one and the same piece or bit of material, as opposed to two separate parts joined together.

The LED device can further comprise phosphor for converting the wavelength of at least part of the light or radiation from the LED chips. The cavity can for example be provided internally with a phosphor coating. That is, the exit windows of the light guiding elements and the additional LED chip placed at the bottom of the cavity can be provided with a phosphor coating. As an alternative to the phosphor coatings, the entire cavity can be filled with a phosphor material. The phosphor, in combination with blue or UV LED chips, allows an LED device emitting for example white light.

Preferably, a filter is interposed between each LED chip and light guiding element, or between each light guiding element and the phosphor, which filter is adapted to transmit unconverted light from the LED chips and reflect converted light. The filters offer the advantage of preventing light losses and they direct all converted light forward towards the cavity. This results in efficient light extraction and increased brightness. Another filter can be placed on top of the phosphor, which filter is adapted to reflect unconverted light. Thus, any unconverted light from the LED chips is reflected back for conversion or mixing. This also results in efficient light extraction and increased brightness.

The cavity of the LED device can further be filled with a clear resin, such as silicone resin, to enhance the out coupling efficiency of the device.

The LED device can further comprise an optical element, such as a collimator, an out coupling lens or a compound parabolic concentrator (CPC), arranged to receive any light emitted from the exit aperture. The collimator offers the advantage that the emission angle can be reduced to any desired value, while the out coupling lens and CFC can enhance the out coupling of light from the device. Preferably, in case the cavity is filled with a clear resin, the optical element is in optical contact with the clear resin.

BRIEF DESCRIPTION OF THE DRAWINGS

This and other aspects of the present invention will now be described in more detail, with reference to the appended drawings showing currently preferred embodiments of the invention.

FIG. 1b is a schematic perspective view of the LED device of FIG. 1a;

FIG. 5b is a schematic perspective view of the LED device of FIG. 5a;

FIG. 6b is a schematic perspective view of the LED device of FIG. 6a; and

DETAILED DESCRIPTION OF THE INVENTION

Figure 1A:
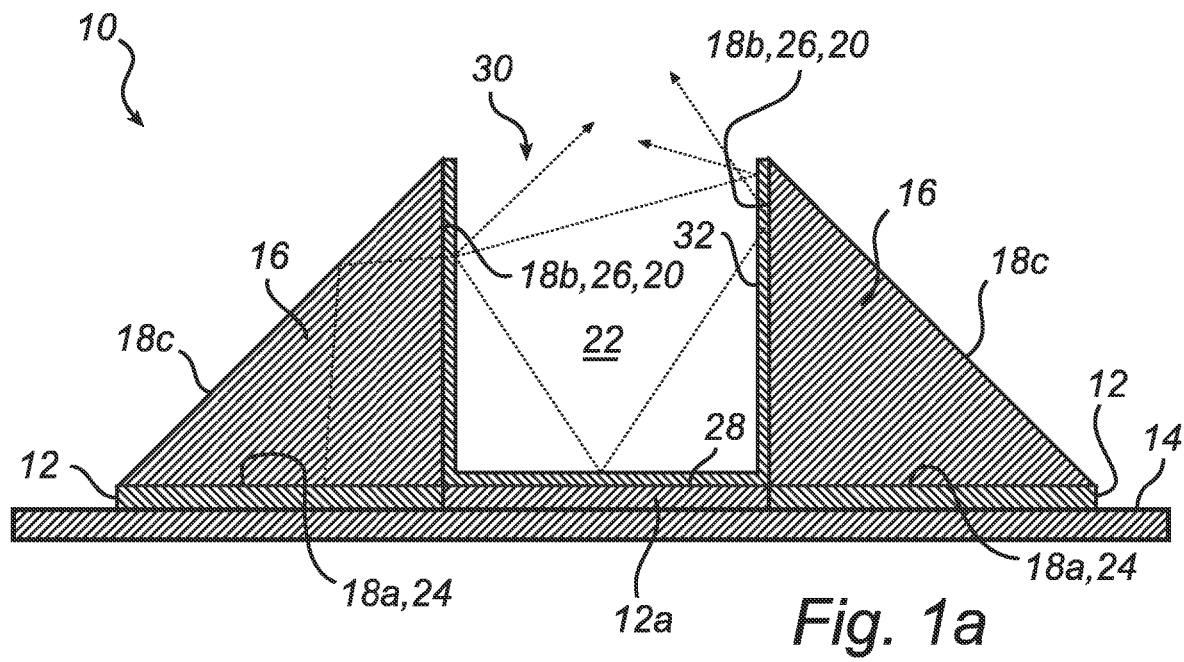
FIG. 1a is a schematic cross-sectional side view of an LED device according to an embodiment of the invention.
Figure 1B:
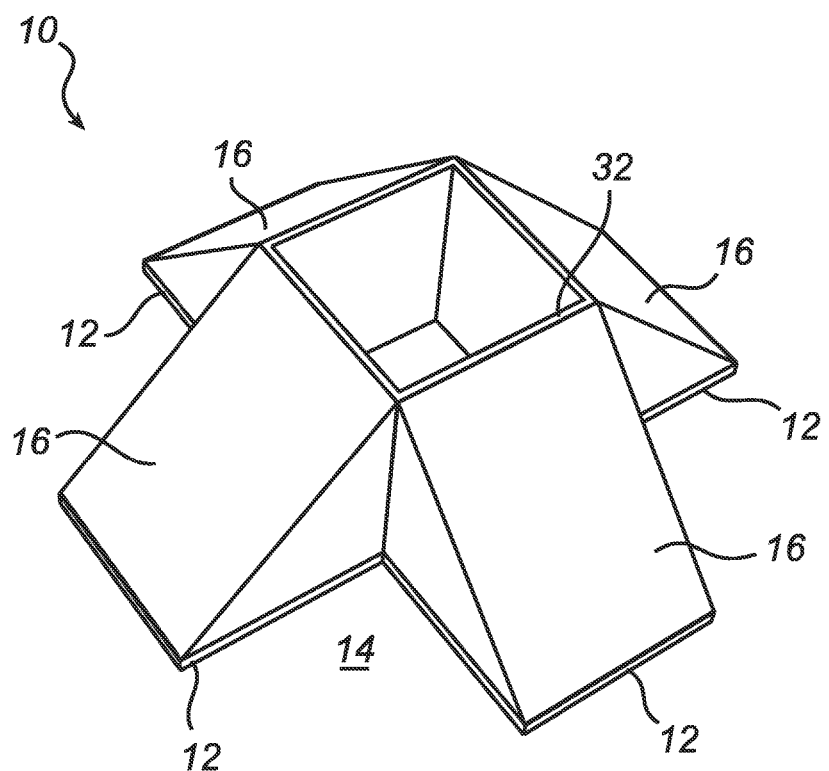

FIGS. 1a and 1b show an LED device 10 according to an embodiment of the invention. The LED device 10 comprises five LED chips 12 placed on a flat substrate 14 in a cross formation. The LED chips 12 are positioned adjacent or almost adjacent to each other on the substrate 14.

Each LED chip 12, except for the centrally positioned LED chip 12a, is provided with a light guiding triangular prism 16. Each prism 16 has a first 18a, second 18b and third 18c side face. The first 18a and the second 18b side faces are arranged at an essentially right angle. The first side face 18a faces the LED chip 12, while the second side face 18b forms an inner side surface 20 of a cavity 22. Further, an entrance window 24 is formed on the first side face 18a, and an exit window 26 is formed on the second side face 18b. All faces of the prisms 16, except for the entrance and exit windows 24 and 26, are covered with a reflective coating (not shown), for allowing transfer of light from the entrance window 24 to the exit window 26. The reflective coating on the prisms is preferably in non-optical contact with the prism to preserve the loss less total internal reflections.

Thus, in FIGS. 1a and 1b, each of the four exit windows 22 forms one of the four inner side surfaces 20 of the cavity 22. Preferably, the size of the entrance and exit windows 24 and 26 corresponds to the size of the square LED chips 12, resulting in a cubic cavity 22. The cavity 22 further has a bottom surface 28, where the central LED chip 12a is positioned, and an exit aperture 30 opposite the bottom surface 28.

Upon operation of the LED device 10, light from the LED chips 12 provided with prisms 16 is coupled into the respective prism 16 through the entrance window 24. The light is then guided through the prism 16 to the exit window 26, and into the cavity 22. At the same time, light from the LED chip 12a at the bottom surface is emitted into the cavity 22. The light can finally exit the cavity 22 through the exit aperture 30. Thus, even though the exit aperture's size corresponds to the size of a single LED chip, it emits light originating from five LED chips, resulting in a high-brightness LED device.

Figure 2:
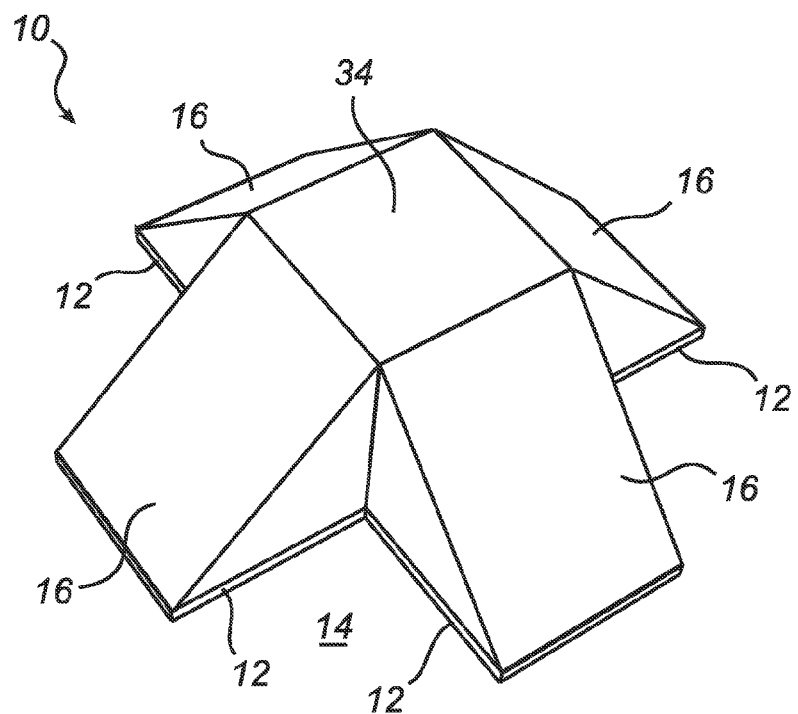
FIG. 2 is a schematic perspective view of a variant of the LED device of FIGS. 1a-1b.

Preferably, the LED chips 12 are adapted to emit blue light or UV radiation. In that case, the exit windows 26 forming the inner surfaces of the cavity 22, as well as the bottom LED chip 12a, can be provided with a phosphor coating 32. For example, in case of blue LED chips, the phosphor coating converts part of the blue light emitted from the LED chips 12 to for example yellow light, which yellow light together with unconverted blue light can generate white light. As an alternative to the phosphor coatings 32, the cavity 22 can be completely filled with a phosphor material 34, as illustrated in FIG. 2. In such a case, more of the blue light will be absorbed by the phosphor, thereby generating more yellow light.

A filter (not shown) which transmits blue light or UV radiation and reflects converted light can optionally be placed between each LED chip and prism or between the prisms and the phosphor or phosphor coating, as well as between the LED chip 12a and the phosphor or phosphor coating. In this way, converted light can be forwarded towards the cavity. The filter can for example be a dichroic mirror. Further, blue or UV reflecting filters (not shown) can be positioned on top of the phosphor coatings or on top of the phosphor material at the exit aperture, in order to reflect back any unconverted light and give it another chance to be converted or mixed. The above-mentioned filters contribute to improve the brightness of the LED device.

Figure 3A:
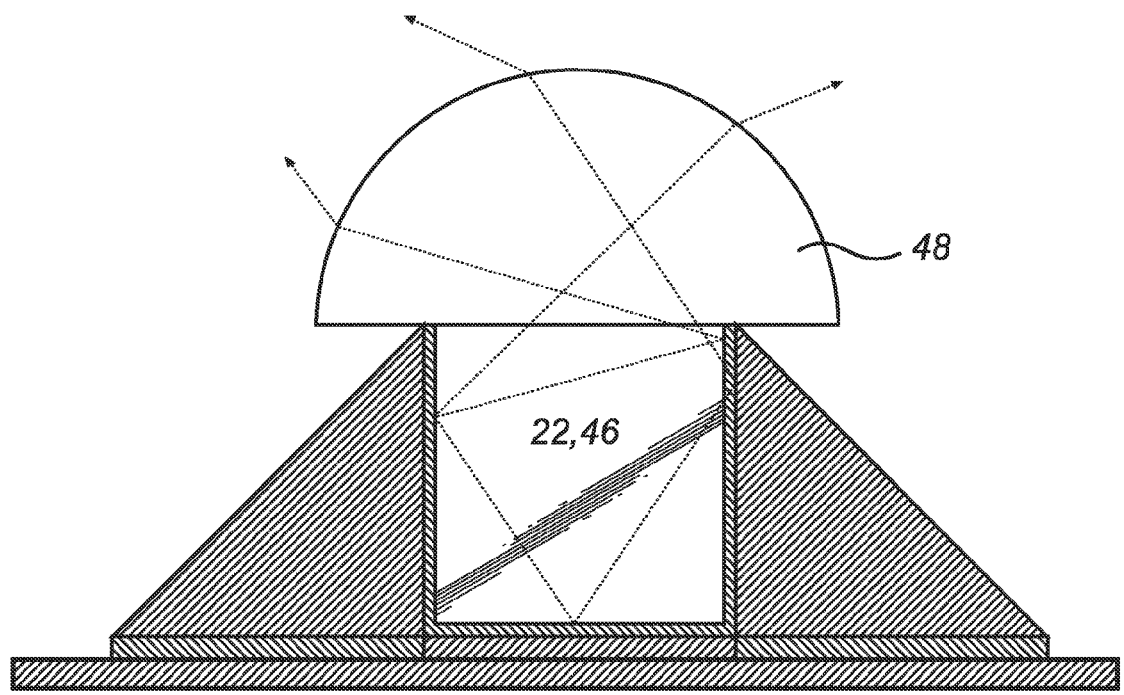
FIGS. 3a-3b are schematic cross-sectional side views of other variants of the LED device of FIGS. 1a-1b.
Figure 3B:
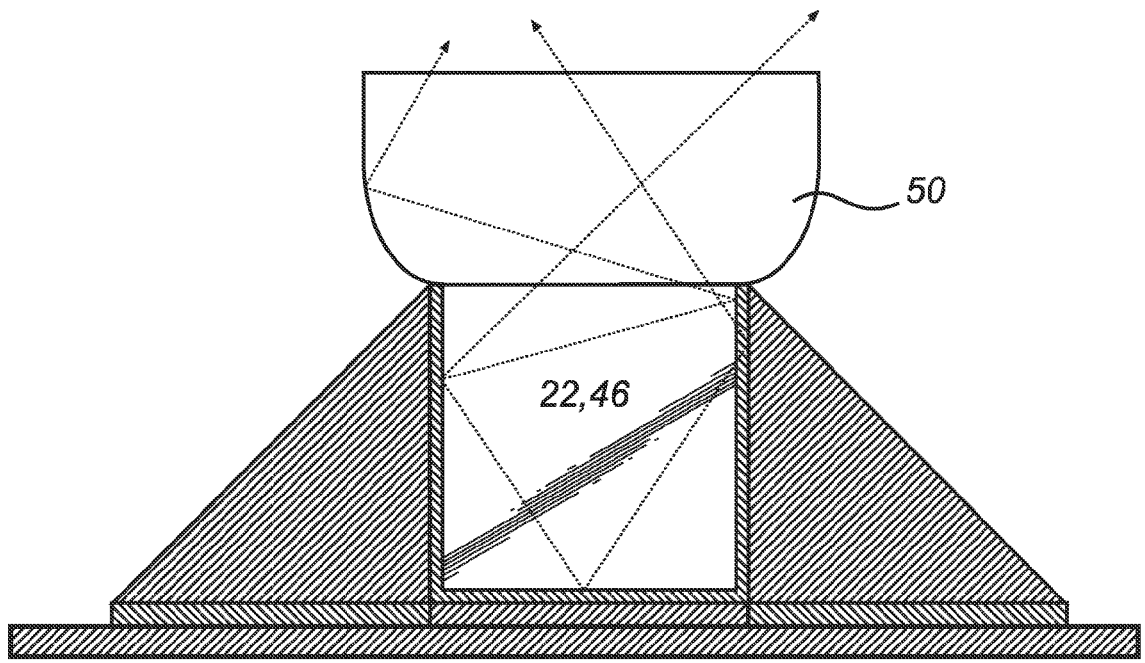

In order to enhance the out coupling efficiency of the LED device, the cavity 22 of the LED device can be filled with a clear resin 46, such as silicone resin, as illustrated in FIGS. 3a-3b. In FIG. 3a, the clear resin is in optical contact (at the exit aperture) with an out coupling lens 48, and in FIG. 3b with a CPC 50, to further enhance the out coupling.

Figure 4:
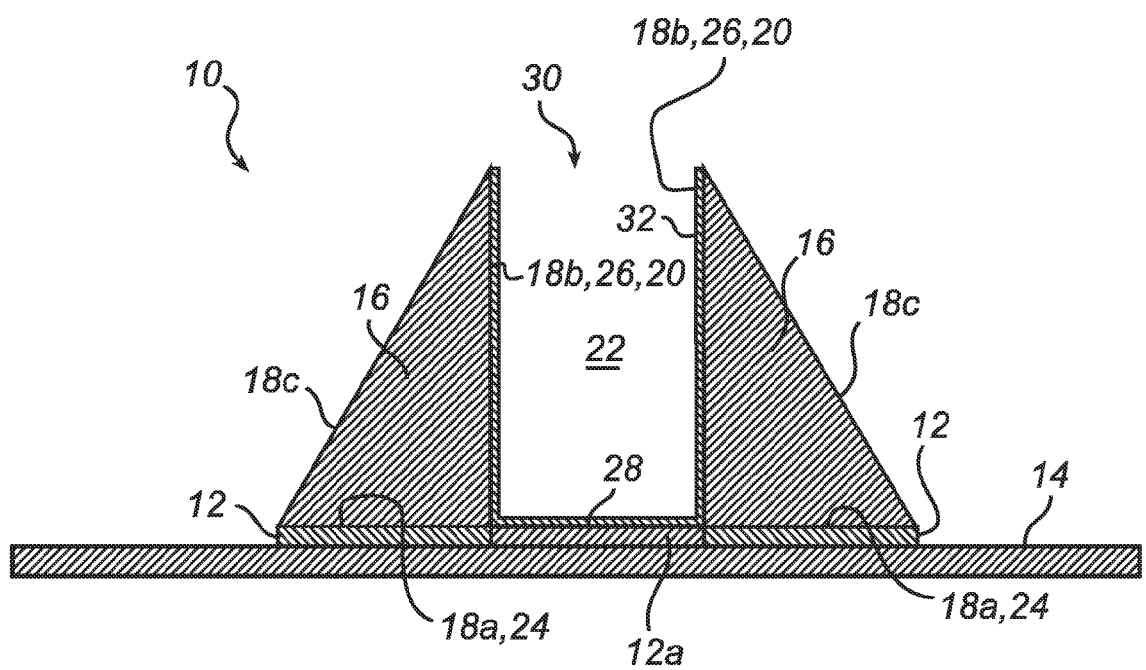
FIG. 4 is a schematic cross-sectional side view of another variant of the LED device of FIGS. 1a-1b.

Another variant of the LED device in FIGS. 1a-1b is illustrated on FIG. 4. In FIG. 4, there is an acute angle between the second side face 18b accommodating the exit window 26 and the third side face 18c, compared to the about 45° angle in FIGS. 1a-1b. The sharper angle improves the amount of total internal reflection inside the prisms 16.

Figure 5A:
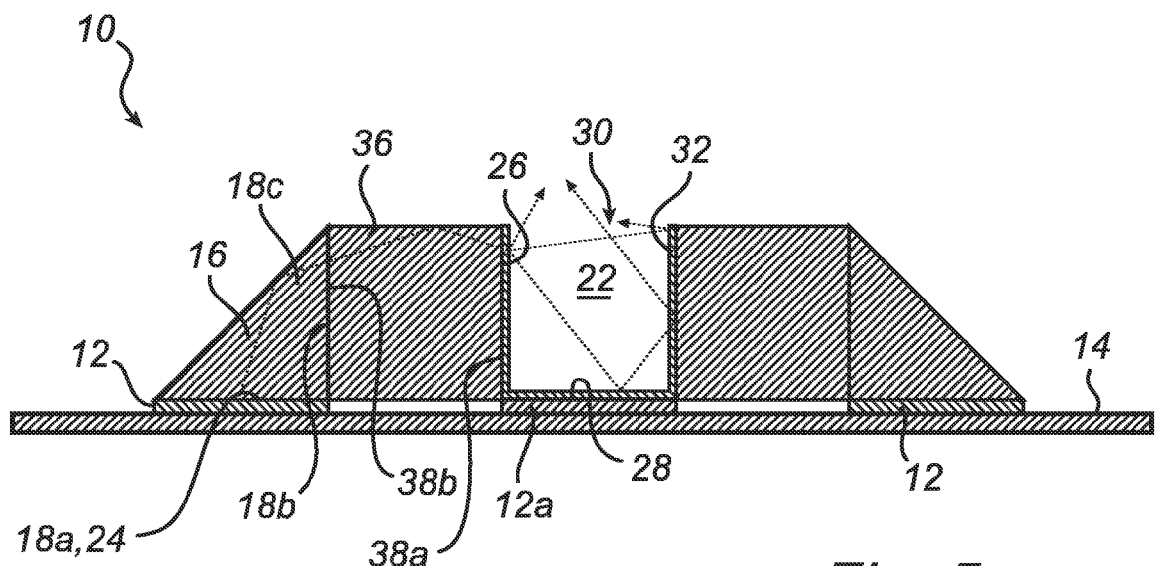
FIG. 5a is a schematic cross-sectional side view of an LED device according to another embodiment of the invention.
Figure 5B:
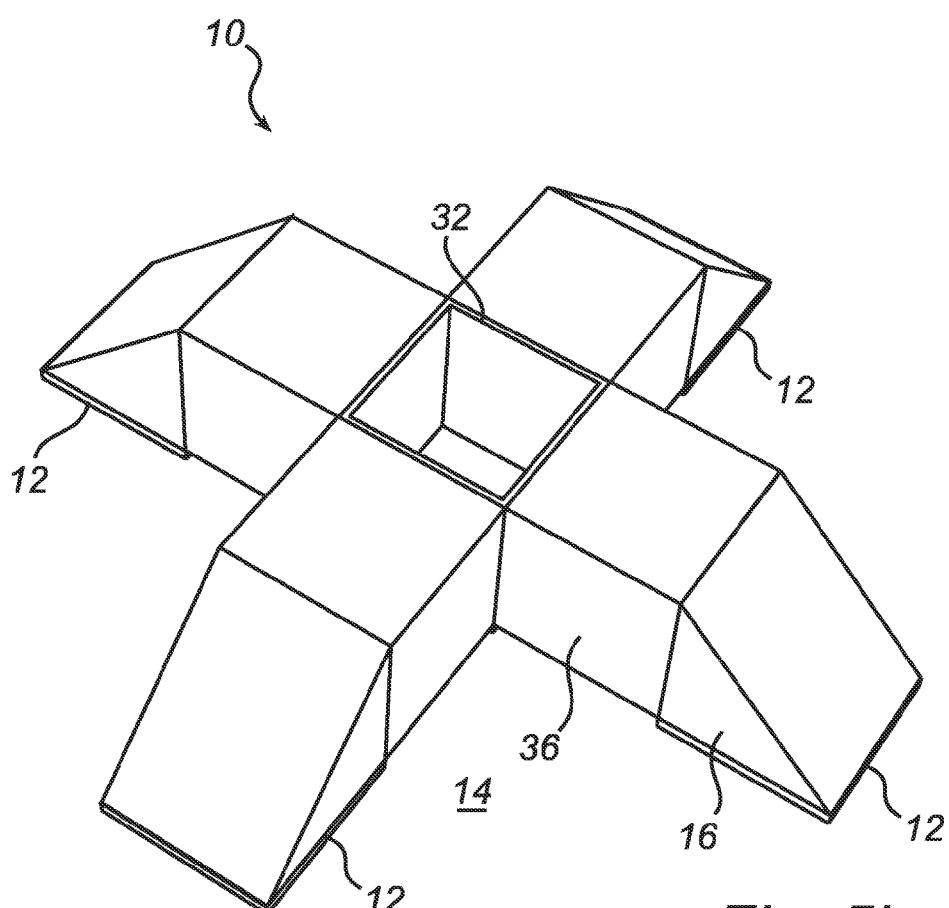

An LED device 10 according to another embodiment of the invention is illustrated in FIGS. 5a-5b. In FIGS. 5a-5b, each triangular prism 16 is extended, at the side face 18b, by a rectangular parallelepiped 36, forming a single light guiding structure. The entrance window 24 is formed on the side face 18a of the prism portion, and the exit window 26 is formed on the face 38a of the rectangular parallelepiped portion opposite the face 38b towards the prism. Each prism 16 and rectangular parallelepiped 36 is preferably formed in one piece. In this embodiment, the LED chips 12 can be positioned further apart compared to the LED device of FIGS. 1-4, which facilitates manufacturing.

Figure 6A:
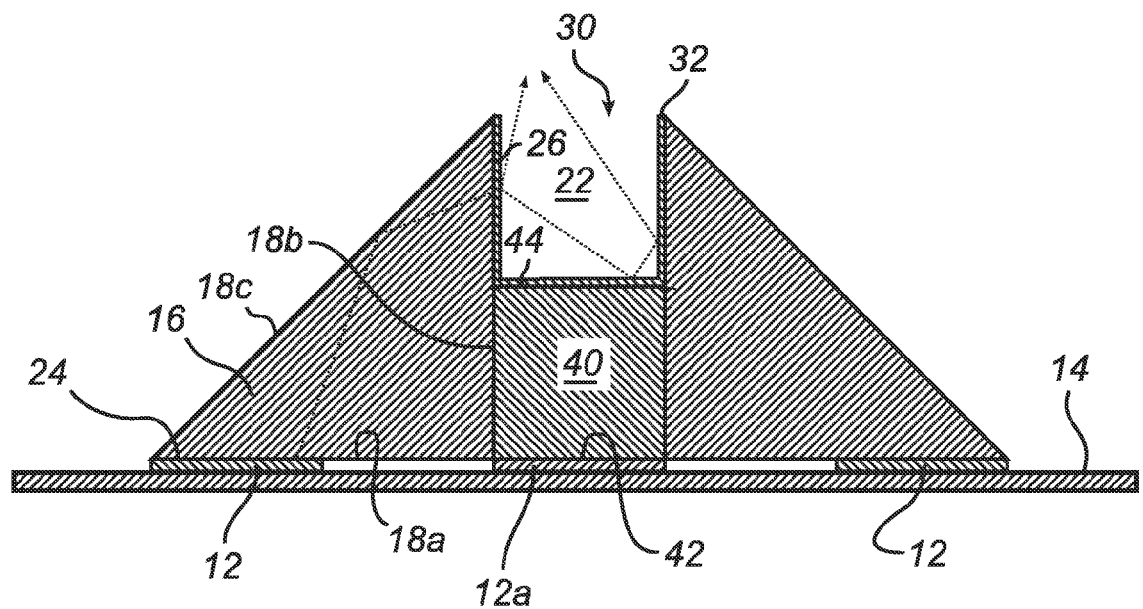
FIG. 6a is a schematic cross-sectional side view of an LED device according to yet another embodiment of the invention.
Figure 6B:
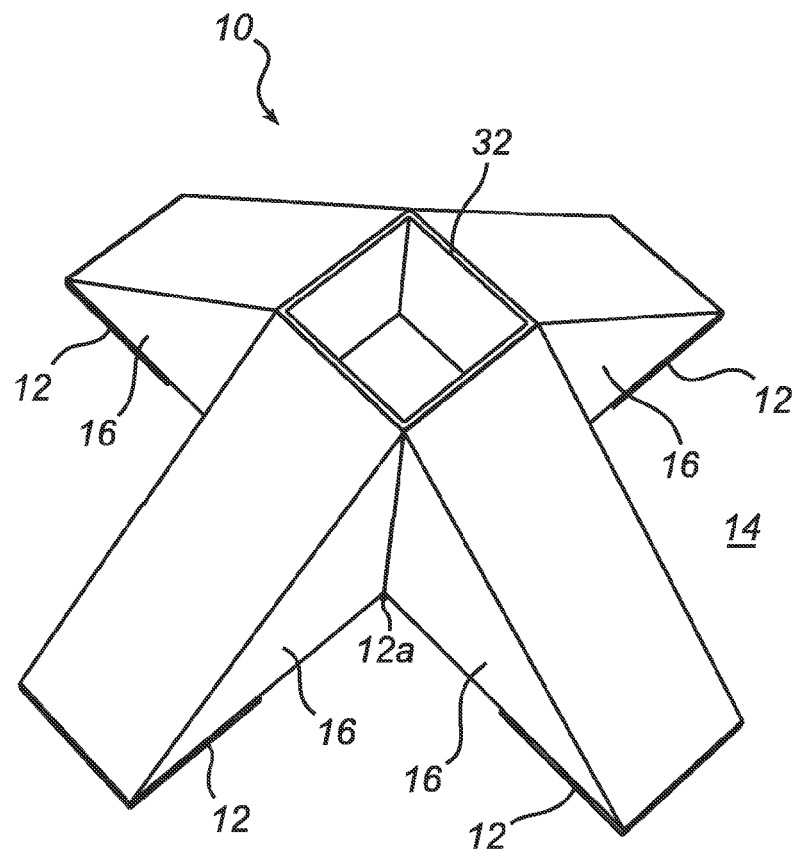

An LED device 10 according yet another embodiment is illustrated in FIGS. 6a-6b. In FIGS. 6a-6b, the LED device comprises triangular prisms 16 as in for example FIG. 1, however the entrance window 24 is formed on only a portion of the first side face 18a, and the exit window 26 is formed on only a portion the second side face 18b. This results in an LED device where the LED chips can be placed apart from each other, and a cavity that is elevated above the surface of the substrate. In this embodiment, the central LED chip 12*a* preferably is provided with an additional light guiding element 40 having an entrance window 42 and an exit window 44, wherein the exit window 44 forms the bottom surface of the cavity. Preferably, the prisms 16 and the additional light guiding element 40 are formed in one piece, which facilitates manufacturing of the LED device.

Figure 7:
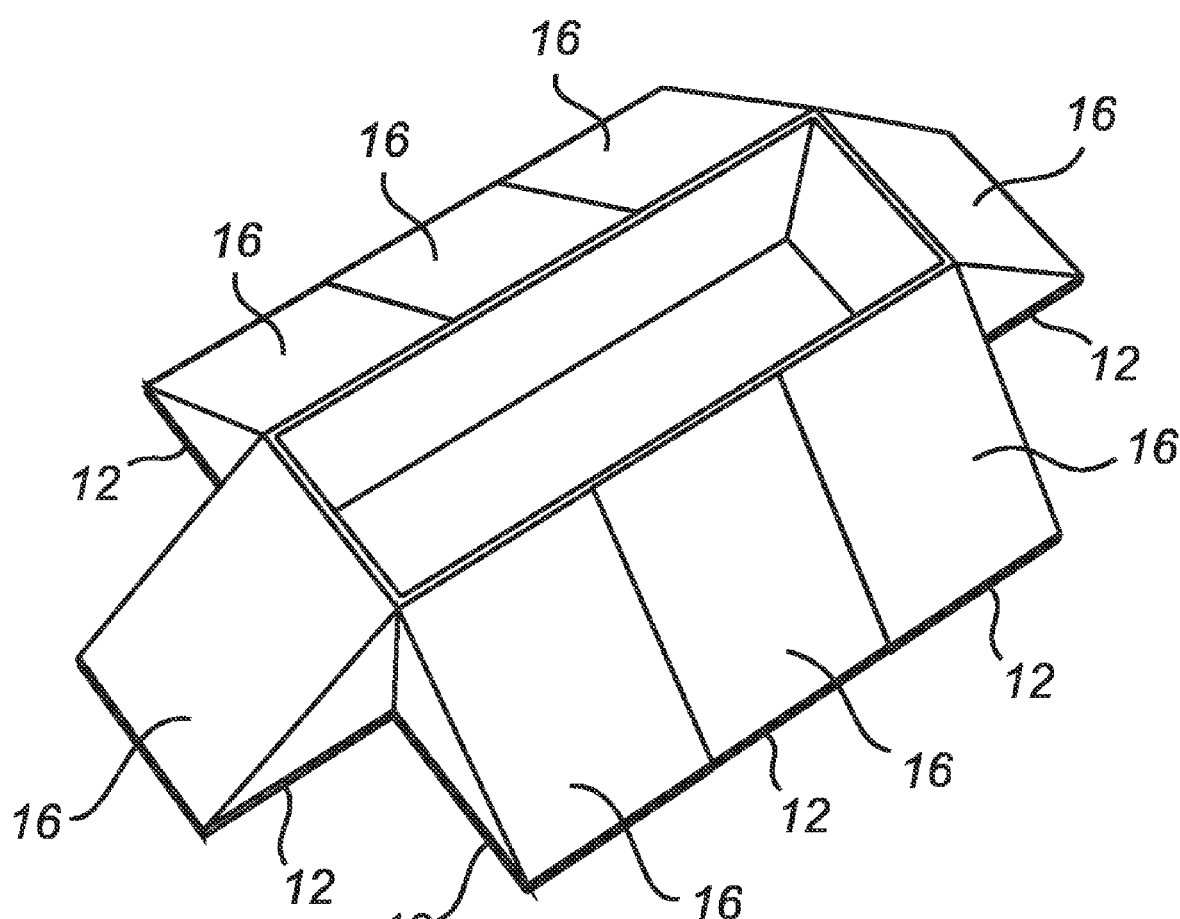
FIG. 7 is a schematic perspective view of an LED device having a rectangular shaped cavity.

The person skilled in the art realizes that the present invention by no means is limited to the preferred embodiments described above. On the contrary, many modifications and variations are possible within the scope of the appended claims. For example, even though an LED device having five LED chips is disclosed above, it will be appreciated that the invention is not limited in this respect, as a different number of LED chips may be used in the LED device. For example, an LED device having three LED chips and a cavity with a triangular bottom surface and exit aperture is envisaged. Further, several chips and light-guiding elements can be arranged side by side, an example of which is disclosed in FIG. 7. In FIG. 7, there is a rectangular shaped cavity with several LED chips arranged at the bottom surface, several LED chips 12 and prisms 16 arranged along the long side of the cavity, and a single LED chip 12 and prism 16 arranged at each short side of the cavity. Alternatively, a single elongated prism 16 can support several of the LED chips 12 placed at one of the long sides of the cavity.

Further, the various aspects described in relation to FIGS. 1-4, such as blue or UV LEDs, wavelength filters, phosphor filled cavity, etc., can be implemented also in the LED devices shown in FIGS. 5-7.

The invention claimed is:

1. A light emitting diode (LED) device (10), comprising:
a plurality of LED chips (12) placed on a substrate (14), and
a plurality of light guiding elements (16, 36) each having an entrance window (24) and an exit window (26),
wherein said elements are arranged for allowing light from at least one LED chip to be transferred from said entrance window to said exit window, and wherein said elements are further arranged so that said exit windows form several inner side surfaces (20) of a cavity (22), which cavity further has an exit aperture (30) for allowing extraction of light from said device.

2. An LED device according to claim 1, wherein said cavity has a bottom surface (28) opposite the exit aperture, and wherein at least one additional LED chip (12*a*) is placed on the substrate for emitting light at the bottom surface of the cavity.

3. An LED device according to claim 1, wherein each light guiding element comprises a triangular prism (16) having a first (18*a*), second (18*b*) and third (18*c*) side face, said first and second side faces being arranged at an essentially right angle.

4. An LED device according to claim 3, wherein said entrance window is formed on at least a portion of one of the right-angled side faces, and said exit window is formed on at least a portion of the other right-angled side face.

5. An LED device according to claim 4, wherein the side face accommodating the exit window and the third side face are arranged at an angle of about 45°.

6. An LED device according to claim 4, wherein the side face accommodating the exit window and the third side face are arranged at an acute angle.

7. An LED device according to claim 3, wherein the each light guiding element further comprises a rectangular parallelepiped (36) extending the triangular prism at one of the right-angled side faces of the triangular prism, and wherein said entrance window is formed on at least a portion of the other right-angled side face, and said exit window is formed on at least a portion of the face (38*a*) of the rectangular parallelepiped opposite the face (38*b*) towards the prism.

8. An LED device according to claim 7, wherein said triangular prism and rectangular parallelepiped are formed in one piece.

9. An LED device according to claim 1, wherein the size of the entrance and exit windows essentially corresponds to the size of the LED chips.

10. An LED device according to claim 1, wherein said cavity internally is provided with a phosphor coating (32) for converting the wavelength of at least part of the light emitted from the LED chips.

11. An LED device according to claim 1, wherein said cavity is filled with a phosphor material (34) for converting the wavelength of at least part of the light emitted from the LED chips.

12. An LED device according to claim 10, wherein a filter is interposed between each LED chip and light guiding element, or between each light guiding element and the phosphor, which filter is adapted to transmit unconverted light and reflect converted light.

13. An LED device according to claim 10, wherein a filter is placed on top of the phosphor, which filter is adapted to reflect unconverted light.

14. An LED device according to claim 1, wherein said cavity is filled with a clear resin (46).

15. An LED device according to claim 1, further comprising an optical element, such as a collimator, an out coupling lens (48) or a compound parabolic concentrator (50), arranged to receive any light emitted from said exit aperture.

* * * * *